United States Patent
Fischer et al.

(10) Patent No.: US 6,207,619 B1
(45) Date of Patent: Mar. 27, 2001

(54) OXIDIC SUPERCONDUCTOR WITH A BISMUTH PHASE OF THE 2223 TYPE AND METHOD OF MANUFACTURE THEREOF

(75) Inventors: Bernhard Fischer, Bruchkoebel; Jens Mueller, Remscheid, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/469,805

(22) Filed: Dec. 22, 1999

(30) Foreign Application Priority Data

Dec. 23, 1998 (DE) ............................. 198 60 074

(51) Int. Cl.$^7$ ..................... C04B 35/64; C04B 35/645
(52) U.S. Cl. ..................... 505/501; 505/482; 505/742
(58) Field of Search ................... 505/482, 501, 505/742, 928

(56) References Cited

U.S. PATENT DOCUMENTS 5,155,092 * 10/1992 Mizuno et al. ................ 505/100

FOREIGN PATENT DOCUMENTS

PCT/US96/08801    5/1996 (WO) .

OTHER PUBLICATIONS

Liu et al "Microstructure, texture and critical current of Ag–shesthed 2223 multifilament typos", Supercond. Sci. Technol. 1999, 12(6) Abstract only.*

Article entitled: "Improvements of microstructural and superconducting properties of Ag–$Bi_2Sr_2CaCu_2O_x$ screen-printed tape by controlled oxygen partial pressure during cooling procedure", Noji et al., *Appl. Phys. Lett.* 63 (6), Aug. 9, 1993, pp. 833–835.

Article entitled: "Microstructural study of Bi (2223)/Ag tapes with $J_c(77$ K, 0 T) values of up to $3.3 \times 10^4$ A cm$^{-2}$", Yamada et al., *Supercond. Sci. Technol.* 4 (1991), pp. 165–171.

Article entitled: "Microstructure and defects in Ag–clad Bi–Pb–Sr–Ca–Cu–O wires prepared through a controlled melt process", Liu et al., *Supercond. Sci. Technol.* 5 (1992), pp. 591–598.

Article entitled: "Advances in the Development of Silver Sheathed (Bi,Pb)2223 Composite Conductors", Carter et al., *IEEE Transactions on Applied Superconductivity*, vol. 5, No. 2, Jun. 1995, pp. 1145–1149.

Article entitled: "Bi–2223 Multifilament Tapes and Multistrand Conductors for HTS Power Transmission Cables", Leghissa et al., *IEEE Transactions on Applied Superconductivity*, vol. 7, No. 2, Jun. 1997, pp. 355–358.

* cited by examiner

Primary Examiner—Mark Kopec
(74) Attorney, Agent, or Firm—Schiff Hardin & Waite

(57) ABSTRACT

A superconductor with the Bi 2223 high $T_c$ phase is manufactured by mulitply deforming and annealing a structure composed of a material matrix and at least one core of a fabricated material of the superconductor material. At least during an initial segment of a cooling process following the final annealing, the oxygen partial pressure is lowered with decreasing temperature at least in a temperature range between 800° C. and 750° C. for stabilizing the 2223 phase. A rapid cooling to room temperature advantageously follows.

16 Claims, 1 Drawing Sheet

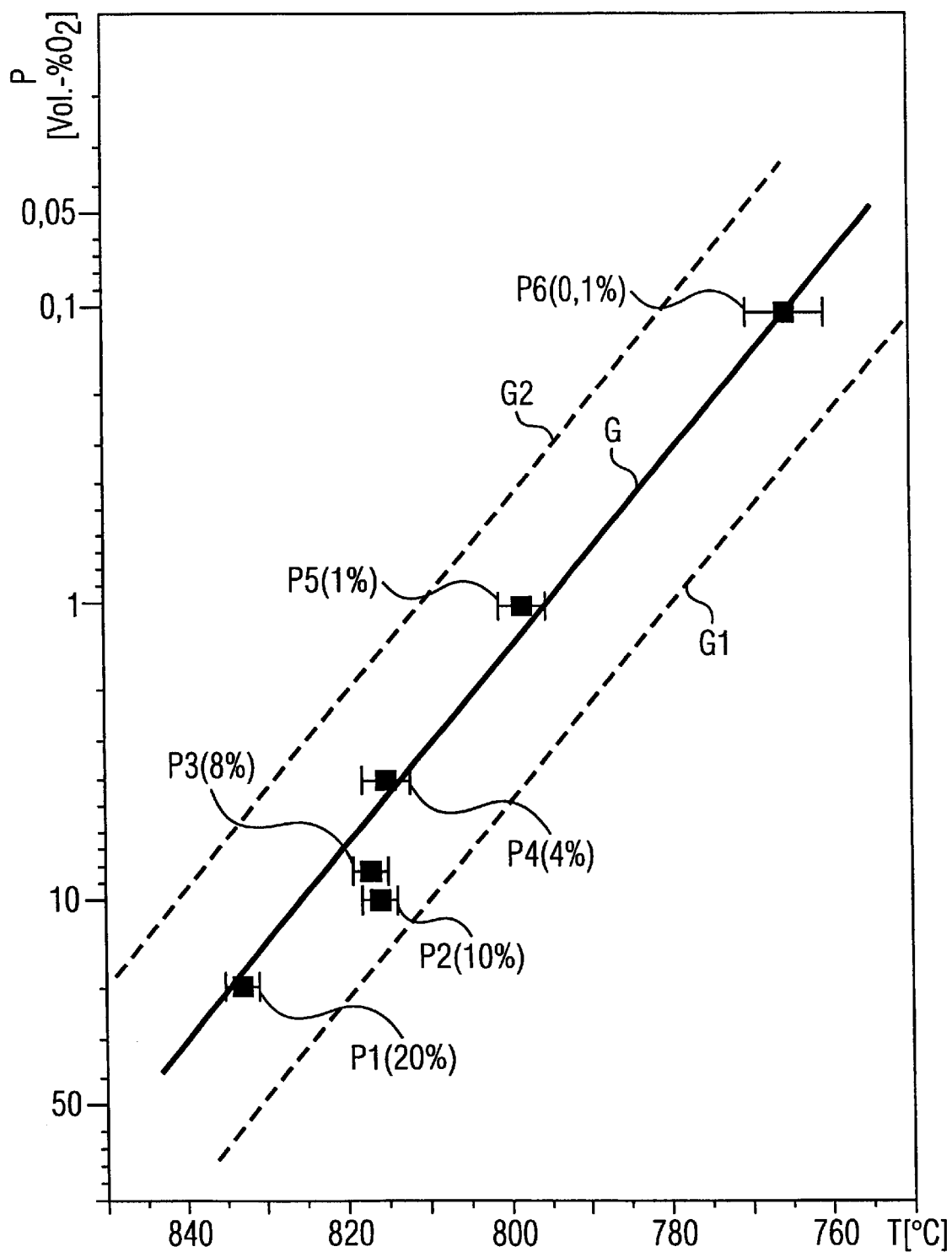

OXIDIC SUPERCONDUCTOR WITH A BISMUTH PHASE OF THE 2223 TYPE AND METHOD OF MANUFACTURE THEREOF

FIELD OF THE INVENTION

The present invention is directed to a method for the manufacture of a superconductor having at least one conductor core embedded in a matrix of normally conductive material. The core comprises a bismuth-containing, oxidic superconductor material with a high $T_c$ phase of the 2223 type. In the method of the present invention, a structure of the matrix material and at least one core of a fabricated material of the superconductor material is produced, and this structure is subjected to a shaping process with a plurality of shaping steps as well as an annealing process with a plurality of annealing steps, whereby the annealing process comprises a final annealing wherein a formation of a high part of the high $T_c$ phase in the conductor core material ensues at predetermined temperature conditions in an oxygen-containing atmosphere and this being followed by a cooling process.

BACKGROUND OF THE INVENTION

Such a method proceeds, for example, from WO 96/39721. The invention is also directed to the employment of such a method. In particular, cuprates on the basis of the bismuth material system Bi-Semiconductor-Ca—Cu—O are included among known superconductive metal oxide compounds having high transition temperatures $T_c$ of at least 77 K, which are therefore also known as high $T_c$ superconductor materials (abbreviated: HTS materials) and enable a cooling by liquid nitrogen ($LN_2$), whereby individual constituents of this material system can be at least partially replaced by others. In particular, a corresponding partial substitution of the Bi constituent by Pb is possible. At least two superconductive phases occur within this Bi-containing material system, this differing on the basis of the number of copper-oxygen lattice planes (layers) within their crystalline unit cells. A superconductive phase having the approximate composition $Bi_2Sr_2CaCu_2O_{8+y}$ has a transition temperature $T_c$ of approximately 85 K (what is referred to as 2-layer or what is referred to as 85 K or 2212 phase), whereas the transition temperature of a superconductive phase with the approximate composition $Bi_2Sr_2Ca_2Cu_3O_{10+x}$ lies at about 110 K (what is referred to as 3-layer or what is referred to as 110 K or 2223 phase). This latter phase is particularly stabilized by a partial substitution of the Bi by Pb.

Attempts are made with these HTS materials to manufacture elongated superconductors in wire or ribbon form. A method considered suitable therefor is what is referred to as the "powder-in-tube technique" that is fundamentally known from the manufacture of superconductors with the classic metallic superconductor material $Nb_3Sn$. According to this technique, a predetermined powder is also introduced into a tubular carrier or, respectively, into a matrix of normally conductive material of, in particular, Ag or an Ag alloy for manufacturing conductors with the aforementioned HTS material. This powder is composed of a fabricated material of the HTS material or contains this material, which generally does not yet exhibit or only slightly exhibits the desired superconductive $T_c$ phase or a phase with lower transition temperature such as, in particular, the 2212 phase.

The structure obtained in this way is subsequently compacted and brought to a desired dimension with shaping steps that can be potentially interrupted by a least one thermal treatment step. Subsequently, the wire-shaped or ribbon-shaped intermediate conductor product obtained in this way is subject to a final annealing for setting or optimizing its superconductor properties or, respectively, for forming the desired high $T_c$ phase, this final annealing being at least partially implemented in an oxygen-containing atmosphere, for example in air (see, for example, Supercond. Sci. Technol., Vol. 4, 1991, pages 165–171 or Vol. 5, 1992, pages 591–598). This final annealing can also be implemented in a plurality of steps or, respectively, at several temperatures, whereby further shaping treatments can also be interposed for forming the ultimate dimension of the final conductor product. According to WO 96/19417, a final annealing with periodically fluctuating temperature management is also possible. Given the method to be derived from the initially cited WO 96/39721, the temperature level in the final annealing is successively lowered from higher to lower temperatures.

When, in a way known in and of itself, a plurality of corresponding ribbon-shaped or wire-shaped high $T_c$ superconductors or their intermediate or conductor products or pre-products are bundled, conductors having a plurality of superconductor cores, what are referred to as multi-core or multi-filament conductors, can also be obtained (see, for example, IEEE Trans. Appl. Supercond., Vol. 5, No. 2, June 1995, pages 1145–1149).

The annealing of the intermediate conductor product in the manufacture of an HTS conductor on the basis of a bismuth cuprate with a phase of the 2223 type is generally implemented given a constant partial oxygen pressure. Work is thereby often carried out with a reduced partial oxygen pressure, whereby the oxygen part of a corresponding atmosphere lies at approximately 8 volume %, and a pressure of the overall atmosphere of approximately 760 Torr (=1013 mbar=1 atm) forms the basis. It has been shown, however, that the proportion of the 2223 phase of the Bi cuprate that forms is comparatively slight. For this reason, attempts have been made to anneal in an atmosphere with a high partial oxygen pressure. A comparatively high proportion of the 2223 phase can then in fact be achieved; the process-engineering outlay for this, however, is comparatively high and the ultimate conductor products nonetheless only have an unsatisfactory critical current density or, respectively, current-carrying capability.

Given the method derivable from WO 96/39721, the intermediate conductor product contains a fabricated material of the superconductor material that comprises a high proportion of a tetragonal or orthorhombic 2212 phase. This intermediate is then subjected to what is referred to as a thermo-mechanical treatment before a final annealing ensues. This thermo-mechanical treatment can comprise a succession of flat processing steps that are interrupted by intermediate annealing steps. The annealing steps should be implemented in an identical atmosphere given an $O_2$ pressure in the range between $10^{-5}$ and 0.04 atm $O_2$. The conversion of the orthorhombic 2212 phase into the desired 2223 phase should then ensue with the terminating annealing step of the final annealing, which is implemented given comparatively higher $O_2$ partial pressure in an atmosphere with 0.003 through 0.21 atm $O_2$. The cooling process following thereupon should be implemented in an atmosphere with constant $O_2$ partial pressure.

SUMMARY OF THE INVENTION

An object of the present invention is to improve the method comprising the initially cited features to the effect that an optimally high proportion of the 2223 phase of the superconductive Bi cuprate is obtained, and the conductor has an adequately high, critical current density at the same time.

This object is inventively achieved in that, during an initial segment of the cooling process at least in a temperature interval between 800° C. and 750° C., the oxygen partial pressure of the atmosphere is lowered with decreasing temperature while at least largely maintaining the stability of the 2223 phase. What is thereby also understood by the initial segment of the cooling process is a segment at the end of the final annealing and/or, potentially, an intermediate annealing, whereby the temperature level of the thermal treatment is (respectively) lowered continuously or in steps proceeding from the high annealing or sintering temperature in the direction toward room temperature or an intermediate temperature level.

The invention is thereby based on the perception that the 2223 phase is not thermodynamically stable during a cooling to a temperature level between 650 and 700° C., at least following a final annealing of the conductor that usually ensues at a temperature between 800° and 840° C. in an atmosphere containing 0.1 through 20 vol. % $O_2$ for formation of the 2223 phase, and can consequently decompose when this cooling ensues in unmodified or, respectively, constant atmosphere in this temperature range. Due to the inventive modification of the annealing atmosphere in the predetermined temperature range down to about 750° C., the decomposition of the 2223 phase is at least largely opposed, i.e., in particular, to not more than 20 vol. %, preferably at most 10 vol. %. A conversion is not possible until below said temperature range. Such a conversion can be opposed by a comparatively rapid cooling to room temperature. The advantages involved in this development of the inventive method are then to be seen therein that the final conductor product exhibits a high proportion of 2223 phase given simultaneously high critical current density, which can lie clearly above 35 $kA/cm^2$.

In the method, advantageously, at least one intermediate annealing preceding the final annealing is provided, this being followed by a cooling process wherein the oxygen partial pressure of the atmosphere is lowered with decreasing temperature while at least largely preserving the stability of the 2223 phase during an initial segment in at least a temperature range between 800° C. and 750° C. Even in such an intermediate annealing, namely, a decomposition of the 2223 that has already at least partly arisen is opposed.

It is especially advantageous when a cooling with a cooling rate of at least 20 K/h, preferably at least 50 K/h and, in particular, at least 100 K/h is undertaken below the temperature interval with the reduction in oxygen partial pressure dependent on the decreasing temperature. A conversion of the 2223 phase into other phase can be advantageously at least largely suppressed by the rapid traversal of the temperature range to room temperature connected therewith.

The inventive method can preferably be employed for manufacturing a ribbonshaped superconductor with a plurality of conductor cores that, in particular, are embedded in a matrix of Ag or an Ag alloy. It is especially given a thin ribbon shape that especially high parts of the 2223 phase with a high degree of a crystalline orientation that is of particular significance in view of high current densities can be achieved. The predetermined oxygen pressure conditions are thereby especially favorable for the required phase formation.

In an embodiment, the present invention provides a method for manufacturing a superconductor comprising the following steps: embedding a conductor core in a conductive matrix material to form a structure, the conductor core comprising a bismuth containing, oxidic superconductor material with a high $T_c$ of a 2223 type; combination shaping and annealing the structure comprising a plurality of shaping steps and a plurality of annealing steps; final annealing structure wherein a formation of a high part of the high $T_c$ phase in the conductor core ensues at predetermined temperature conditions exceeding 835° C. in an atmosphere comprising a partial pressure of oxygen; and cooling the structure in said atmosphere to a temperature ranging from 800° C. to 750° C. and reducing the oxygen partial pressure of the atmosphere to stabilize the superconductor material as the structure is cooled.

In an embodiment, the method further comprises the following steps between the step combination shaping and annealing and the step final annealing: intermediate annealing the structure in an atmosphere comprising a partial pressure of oxygen, and intermediate cooling of the structure in said atmosphere to a temperature ranging from 800° C. to 750° C. and reducing the oxygen partial pressure to stabilize the superconductor material as the structure is cooled.

In an embodiment, the reducing of the oxygen partial pressure is commenced as the temperature of the structure is reduced below 835° C.

In an embodiment, the reducing of the oxygen partial pressure is commenced as the temperature of the structure is reduced below 800° C.

In an embodiment, the reducing of the oxygen partial pressure is carried out as the temperature of the structure is reduced from 800° C. to 700° C.

In an embodiment, the reducing of the oxygen partial pressure is carried out as the temperature of the structure is reduced from 835° C. to 700° C.

In an embodiment, the reducing of the oxygen partial pressure in the intermediate cooling step is commenced as the temperature of the structure is reduced below 835° C.

In an embodiment, the reducing of the oxygen partial pressure in the intermediate cooling step is commenced as the temperature of the structure is reduced below 800° C.

In an embodiment, the reducing of the oxygen partial pressure is carried out in steps.

In an embodiment, the reducing of the oxygen partial pressure is carried out gradually and continuously.

In an embodiment, during the cooling step, in a diagram with linear scale of the temperature T and logarithmic scale of the oxygen partial pressure p, a plot of oxygen partial pressure p versus temperature T proceeds along a straight line through a first point with T=835° C. and p=20 vol. % and through a second point with T=765° C. and p=0.1 vol. % with a total pressure of the atmosphere being 1013 mbar.

In an embodiment, after the cooling step, the structure is further cooled at a rate of at least 20 K/h and the oxygen partial pressure is further reduced.

In an embodiment, after the cooling step, the structure is further cooled at a rate of at least 50 K/h and the oxygen partial pressure is further reduced.

In an embodiment, after the cooling step, the structure is further cooled at a rate of at least 100 K/h and the oxygen partial pressure is further reduced.

In an embodiment, the matrix comprises Ag.

In an embodiment, the matrix comprises an Ag alloy.

Other objects and advantages of the present invention will become apparent upon reading the following detailed description and appended claims and upon reference to the accompanying drawings.

BRIEF DESCRIPTION OF THE DRAWING

For further explanation of the invention and the developments thereof, the drawing shall be referred to below.

FIG. 1 illustrates, graphically, $O_2$ partial pressures of an $O_2$-containing atmosphere dependent on the temperature decrease optimized for an inventive cooling process.

It should be understood that the drawings are not necessarily to scale and that the embodiments are sometimes illustrated by graphic symbols, phantom lines, diagrammatic representations and fragmentary views. In certain instances, details which are not necessary for an understanding of the invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

A wire-shaped or, in particular, ribbon-shaped final conductor product of a superconductor is to be manufactured with the inventive method, this containing at least one conductor core embedded in a matrix of normally conducting material such as, in particular, Ag or an Ag alloy. It can be particularly advantageously employed for the manufacture of a ribbon-shaped, multi-core superconductor. The at least one conductor core should comprise a Bi-containing, oxidic superconductor material with a high proportion, i.e. at least 50 vol. %, of a high $T_c$ phase of the 2223 type. In the method, a structure of the matrix material is first produced in a known way (see said WO 96/19417 or WO 96/39721), at least one core of a fabricated material of the superconductor material being arranged therein. This structure is then subjected to a shaping process having a plurality of shaping steps as well as to an annealing process having a plurality of annealing steps. The shaping and annealing steps can thereby alternate or be implemented simultaneously as well. In this way, an intermediate conductor product is obtained that generally already exhibits the ultimate dimension of the final conductor product but must still be subject to a final annealing (sinter annealing) with subsequent cooling process. A first segment of the cooling process, which generally immediately follows the final annealing, should thereby be inventively implemented.

During the cooling at least in a temperature range between 800° C. and 750° C., the initial $O_2$ partial pressure provided for the final annealing should be reduced with decreasing temperature for this purpose. This measure can also be advantageously expanded to a temperature range whose upper temperature level lies at approximately 835° C. and/or whose lower temperature level lies at approximately 700° C. The upper temperature level is thereby dependent on the annealing temperature standard for the final annealing that, for example, lies between 828 and 840° C. for an atmosphere with 20 vol. % $O_2$.

The conductor is advantageously cooled comparatively rapidly below the lower temperature level of the range with the decreasing $O_2$ partial pressure. A cooling rate between 20 K/h and 100 K/h, for example of 50 K/h, is to be considered especially beneficial from the point of view of avoiding a decomposition of the 2223 phase.

An optimized $O_2$ content (in vol. %) of the atmosphere surrounding the conductor with an overall pressure of 1013 mbar dependent on the decreasing temperatures during the first segment of the cooling process proceeding from the annealing temperature of the final annealing can be read from the diagram of the Figure. The optimized conditions thereby define a straight line G that derives given a linear scale of the temperature T (in abscissa direction) and a logarithmic scale of the $O_2$ partial pressure p reproduced by the $O_2$ content (in ordinate direction). This straight line passes through a first point at T=765°, p=0.1% and through a second point at T=835°, p=20%. Operating points to be assigned to this straight line and for which the pressure conditions p=20%, p=10%, p=8%, p=4%, p=1% as well as p=0.1% derive are referenced P1 through P6. The measuring limits to be allocated to them are illustrated by bars. Deviations of the pressure by ±10% compared to the values fixed by the straight line G are still to be considered optimum.

It can be generally stated that optimized $O_2$ partial pressure conditions derive following the final annealing when, given a decrease in the temperature, a value is selected for the $O_2$ partial pressure that lies within a range that is located between two parallels to the straight line G that are referenced G1 and G2. In the selected illustration of the Figure with linear scale for the temperature T and logarithmic scale for the $O_2$ partial pressure p, the straight line G1 proceeds approximately through a first point at T=820°, p=20% and through a second point at T=750°, p=0.1%. The straight line G2 proceeds approximately through a first point at T=850°, p=20% and a second point at T=765° C., p=0.03%.

According to a specific exemplary embodiment for manufacturing a ribbon-shaped multi-filament superconductor with 55 filaments in an Ag matrix and a high proportion of the 2223 phase, an embodiment as described, for example, in IEEE Trans. Appl. Supercond., Vol. 7, No. 2, June 1997, pages 355 through 358, formed the basis. The final annealing was thereby undertaken over 5 through 10 hours (=minimum time duration) at a temperature level of 833° given a 20 vol. % $O_2$ part (in air). This was followed by a thermal treatment step over a time span of 4 through 5 hours, whereby the temperature was continuously lowered to 760° C. and, inventively, the oxygen partial pressure was reduced to 0.1% by pumping off the atmosphere. Corresponding cooling processes with reduction of the oxygen partial pressure had also ensued after at least two intermediate annealings that preceded the final annealing and that were interrupted by rolling steps. The conductor manufactured in this way then advantageously exhibited a critical current density $J_c$ (after all annealing treatments) of approximately 40 kA/cm². A conductor manufactured for comparison purposes and that was always annealed only at 8 vol. % $O_2$ and was subsequently cooled to room temperature upon retention of this atmosphere in the furnace, by contrast, exhibited a critical current density $J_c$ of approximately 25 A/cm² after all annealing treatments.

The dwell times at the respective temperature level are basically arbitrary for the inventive reduction of the $O_2$ partial pressure dependent on the lowering of the temperature. The inventively fashioned segment of the cooling process can therefore also be viewed as the final phase of the final annealing given longer dwell times at the respective temperature level.

In the above explanation of the inventive method, the $O_2$ partial pressure was only considered during an initial segment of a cooling process that follows the terminating annealing step for formation of the high $T_c$ phase. Advantageously, corresponding measures can also follow intermediate annealing steps that precede the terminating annealing step and are separated, for example, by shaping steps.

In the consideration of the $O_2$ partial pressure, further, this was respectively presented by the $O_2$ (in vol. %) of the atmosphere surrounding the conductor, based on an overall pressure (atmospheric pressure) of 1013 mbar. The respective $O_2$ partial pressure in mbar can be directly calculated therefrom. Of course, the atmosphere need not comprise an overall pressure of 1013 mbar in all cases in that, for example, an inert gas is added to a corresponding extent. It is likewise also possible to set the desired $O_2$ partial pressure by a corresponding lowering of the overall pressure of the atmosphere.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. A method for manufacturing a superconductor comprising the following steps:

embedding a conductor core in a conductive matrix material to form a structure, the conductor core comprising a bismuth-containing, oxidic superconductor material with a high transition temperature $T_c$ of a 2223 phase;

combination shaping and annealing the structure with a plurality of shaping steps and a plurality of annealing steps;

final annealing the structure wherein a formation of a high part of the high $T_c$ phase in the conductor core occurs at predetermined temperature conditions exceeding 835° C. in an atmosphere comprising a partial pressure of oxygen; and cooling the structure in said atmosphere in a temperature interval at least between 800° C. and 750° C. while lowering the oxygen partial pressure of the atmosphere while substantially maintaining stability of the 2223 phase.

2. The method of claim 1 further comprising the following steps between the step combination shaping and annealing and step final annealing:

intermediately annealing the structure in an atmosphere comprising a partial pressure of oxygen; and intermediately cooling the structure in said atmosphere to a temperature ranging from 800° C. to 750° C. and reducing the oxygen partial pressure to stabilize the superconductor material as the structure is cooled.

3. The method of claim 1 wherein the reducing of the oxygen partial pressure is commenced as the temperature of the structure is reduced below 835° C.

4. The method of claim 1 wherein the reducing of the oxygen partial pressure is commenced as the temperature of the structure is reduced below 800° C.

5. The method of claim 1 wherein the reducing of the oxygen partial pressure is carried out as the temperature of the structure is reduced from 800° C. to 700° C.

6. The method of claim 1 wherein the reducing of the oxygen partial pressure is carried out as the temperature of the structure is reduced from 835° C. to 700° C.

7. The method of claim 2 wherein the reducing of the oxygen partial pressure in the intermediate cooling step is commenced as the temperature of the structure is reduced below 835° C.

8. The method of claim 2 wherein the reducing of the oxygen partial pressure in the intermediate cooling step is commenced as the temperature of the structure is reduced below 800° C.

9. The method of claim 4 wherein the reducing of the oxygen partial pressure is carried out in steps.

10. The method of claim 1 wherein the reducing of the oxygen partial pressure is carried out gradually and continuously.

11. The method of claim 1 wherein, during the cooling step, in a diagram with linear scale of the temperature T and logarithmic scale of the oxygen partial pressure p, a plot of oxygen partial pressure p versus temperature T proceeds along a straight line through a first point with T=835° C. and p=20 vol. % and through a second point with T=765° C. and p=0.1 vol. % with a total pressure of the atmosphere being 1013 mbar.

12. The method of claim 1 wherein after the cooling step, the structure is further cooled at a rate of at least 20 K/h and the oxygen partial pressure is further reduced.

13. The method of claim 1 wherein after the cooling step, the structure is further cooled at a rate of at least 50 K/h and the oxygen partial pressure is further reduced.

14. The method of claim 1 wherein after the cooling step, the structure is further cooled at a rate of at least 100 K/h and the oxygen partial pressure is further reduced.

15. The method of claim 1 wherein the matrix comprises Ag.

16. The method of claim 1 wherein the matrix comprises an Ag alloy.

* * * * *